United States Patent [19]

Tanaka et al.

[11] Patent Number: 4,900,894

[45] Date of Patent: Feb. 13, 1990

[54] METHOD OF HEATING A QUARTZ GLASS TUBE

[75] Inventors: Gotaro Tanaka; Hiroshi Suganuma; Akira Urano; Masahiro Takagi; Shuńichi Mizuno, all of Yokohama, Japan

[73] Assignee: Sumitomo Electric Industries, Ltd., Osaka, Japan

[21] Appl. No.: 296,778

[22] Filed: Jan. 13, 1989

[30] Foreign Application Priority Data

Jan. 18, 1988 [JP] Japan .................................. 63-7008

[51] Int. Cl.$^4$ ........................ B23K 9/00; C03B 37/01
[52] U.S. Cl. ........................ 219/121.59; 219/121.38; 219/10.55 M; 65/2; 65/3.12; 65/108
[58] Field of Search ................. 219/10.55 A, 10.55 R, 219/10.55 M, 121.59, 121.37, 121.38; 65/2, 12, 102, 3.12, 108, 269, 292, 284

[56] References Cited

U.S. PATENT DOCUMENTS

| | | | |
|---|---|---|---|
| 4,349,373 | 9/1982 | Sterling et al. | 65/3.12 |
| 4,508,554 | 4/1985 | Beerwald et al. | 65/3.12 |
| 4,714,589 | 12/1987 | Auwesda et al. | 65/3.12 |
| 4,746,345 | 5/1988 | Pluigms et al. | 65/2 |
| 4,838,915 | 6/1989 | Hassler | 219/10.55 M |

Primary Examiner—M. H. Paschall
Attorney, Agent, or Firm—Cushman, Darby & Cushman

[57] ABSTRACT

A method of heating a quartz glass tube with microwaves, which method comprises supplying a gas for plasma generation in the quartz glass tube, applying microwaves to the quartz glass tube so as to generate a hot plasma in the quartz glass tube and to preheat the quartz glass tube, and then discontinuing the supply of the gas for plasma generation while applying the microwaves, whereby the quartz glass tube absorbs the microwaves to heat the quartz glass tube to a sufficient temperature in a very quick and clear manner.

8 Claims, 3 Drawing Sheets

Fig. 3.

```
┌─────────────────────────────────────────────┐
│ SUPPLYING THE GAS FOR PLASMA                │
│ GENERATION IN THE QUARTZ GLASS TUBE         │
└─────────────────────────────────────────────┘
                      ↓
┌─────────────────────────────────────────────┐
│         IRRADIATING THE MICROWAVE           │
└─────────────────────────────────────────────┘
                      ↓
┌─────────────────────────────────────────────┐
│         IRONIZING THE GAS FOR               │
│            PLASMA GENERATION                │
└─────────────────────────────────────────────┘
                      ↓
┌─────────────────────────────────────────────┐
│      PREHEATING THE QUARTZ GLASS TUBE       │
└─────────────────────────────────────────────┘
                      ↓
┌─────────────────────────────────────────────┐
│ DISCONTINUING SUPPLY OF THE GAS             │
│ FOR PLASMA GENERATION                       │
└─────────────────────────────────────────────┘
                      ↓
┌─────────────────────────────────────────────┐
│         ABSORBING THE MICROWAVE             │
└─────────────────────────────────────────────┘
                      ↓
┌─────────────────────────────────────────────┐
│    HEAT GENERATION BY THE QUARTZ GLASS      │
└─────────────────────────────────────────────┘
```

METHOD OF HEATING A QUARTZ GLASS TUBE

BACKGROUND OF THE INVENTION

1. Field of the Invention

The present invention relates to a method of heating a quartz glass tube including a quartz based glass tube. More particularly, it relates to a method of heating a quartz glass tube by using a microwave, which method is suitable for the preparation of a quartz glass optical fiber since the glass tube can be quickly heated without contamination from a heat source.

2. Description of the Related Art

In one of the methods for heating a quartz glass tube, heat is generated by the quartz glass tube itself through absorption of a microwave. In this case, although a dielectric loss of the quartz glass is very small at room temperature, it becomes larger at an elevated temperature so that the microwave can be substantially absorbed. It is reported that, as shown in FIG. 1, a quartz glass material 1 is preheated to a temperature of not less than 1,000° C. with an oxyhydrogen burner 13 or the like, a preheated portion of the quartz glass material 1 is immediately introduced into a microwave applicator 12 such as a waveguide or a resonator and thereby the preheated portion absorbs the microwave (cf. J. of Lightwaves Tech., vol. LT-4, No. 10, Oct. 1986, pp. 1569).

However, it is difficult to heat sufficiently an internal portion of the quartz glass material by the method of FIG. 1 since the quartz glass has a very small thermal conductivity. Further, since an outer surface of the preheated glass material is easily cooled during transferring the preheated glass material to the microwave applicator, it is very difficult to have the quartz glass material absorb the microwave so that the quartz glass material cannot be heated sufficiently by the conventional method utilizing the usual waveguide. Since preheating with an external heating source such as the oxyhydrogen burner tends to contaminate the quartz glass, it is desired to prevent contamination in a method of heating the quartz glass, particularly for producing the optical fiber.

SUMMARY OF THE INVENTION

An object of the present invention is to provide a novel method utilizing the microwave, which method can sufficiently heat the quartz glass in a quick and clear manner.

Without employing the wasteful method which comprises preheating the quartz glass with the external heat source such as the oxyhydrogen burner and then transferring the preheated portion of the quartz glass to the microwave applicator, it has been studied to provide a method wherein the quartz glass is preheated in the microwave applicator and the microwave is applied to the quartz glass in the applicator, and it has been found that a hot plasma can be generated from a gas from which plasma is easily generated can be utilized for preheating the quartz glass.

The present invention provides a method of heating a quartz glass tube with a microwave, which method comprises supplying a gas for plasma generation in the quartz glass tube, applying a microwave to the quartz glass tube so as to generate a hot plasma in the quartz glass tube and to pre-heat the quartz glass tube, and then discontinuing supply of the gas for plasma generation while applying the microwave, whereby causing the quartz glass tube to absorb the microwave.

BRIEF DESCRIPTION OF THE DRAWINGS

FIG. 3 is a flow chart of the heating steps of the quartz glass tube according to the present invention.

DETAILED DESCRIPTION OF THE INVENTION

Examples of the gas for plasma generation to be used in the method of the present invention are an inert gas such as argon (Ar), helium (He), oxygen $O_2$) and nitrogen ($N_2$) Among them, argon is most preferable, since the hot plasma can be easily generated therefrom and argon has no bad effect on the quartz glass tube because of its inactivity. The microwave preferably has a frequency of 0.1 to 10 GHz, more preferably around 2.4 GHz since good results are achieved.

The quartz glass to be used according to the present invention is usually a pure quartz, although it may contain an additive such as fluorine, $P_2O_5$, $GeO_2$ or $BeO_3$. The quartz glass tube usually has an outer diameter of 10 to 100 mm and an inner diameter of 5 to 80 mm.

The present invention will be explained further in detail by making reference to the accompanying drawings.

Figure 2:
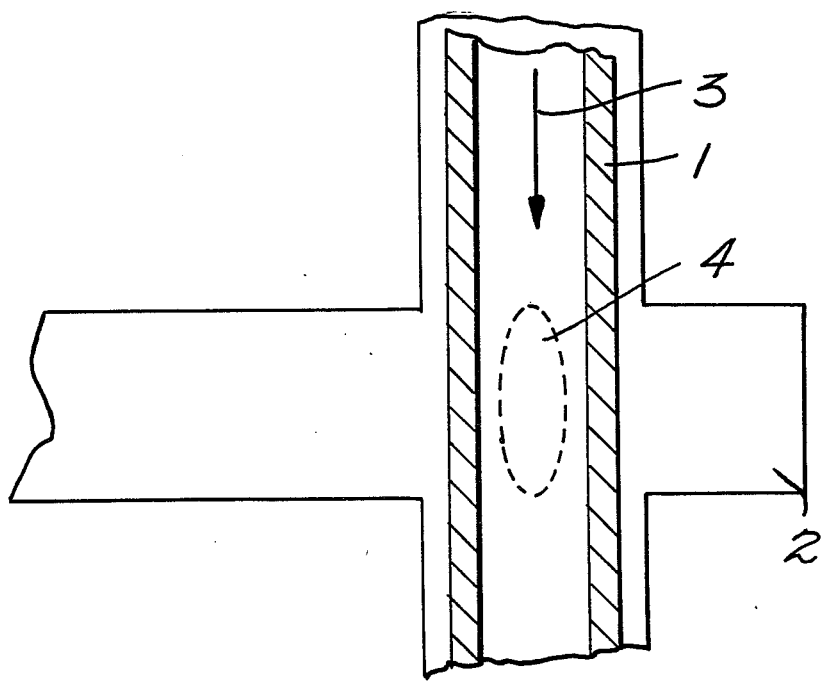
FIG. 2 is a schematic view of one embodiment of the heating method according to the present invention.

FIG. 2 is a schematic view of an embodiment of the heating method according to the present invention. FIG. 3 is a flow chart of the heating steps of the quartz glass tube according to the present invention. In FIG. 2, a quartz glass tube 1 to be heated is inserted in a microwave irradiation member 2 (which is a stationary-wave type in this embodiment). Firstly, a gas for plasma generation 3 such as argon is introduced in the quartz glass tube 1. Prior to the introduction of the gas, an electrically conductive rod with high heat-resistance (not illustrated) such as a carbon rod or a tungsten rod is inserted in a microwave irradiated portion of the tube 1. When the irradiation of the microwave is started and a power is increased, discharge vigorously occurs at a tip end of the electrically conductive rod and the gas for plasma generation 3 is ionized to generate a hot plasma 4. The quartz glass tube 1 is preheated by the hot plasma so that a temperature of the tube 1 can rise to at least 1200° C., for example about 1500° C. The quartz glass tube may be preheated by the hot plasma for at least 5 seconds, preferably for 10 seconds to 5 minutes. Since the preheating utilizes the heat in an internal portion of the quartz glass tube and is carried out in the microwave atmosphere, the heat loss is extremely decreased which loss occurs until the following step wherein the quartz glass tube is caused to absorb the microwave. After preheating, when supply of the gas for plasma generation 3 is discontinued, the quartz glass tube 1 can absorb the microwave immediately. The quartz glass tube 1 may be caused to absorb the microwave for at least 5 seconds, preferably for 10 seconds to 5 minutes so that the quartz glass tube is heated to at least 1300° C., preferably 1500 to 2000° C. When the plasma 4 is present, the plasma 4 absorbs the microwave in a larger amount than the quartz glass tube 1 so that the quartz glass tube 1 hardly absorbs the microwave and a heating efficiency is deteriorated.

The gas for plasma generation is preferably supplied under a pressure of 0.1 to 1.5 kg/cm², preferably an atmospheric pressure. When the pressure is lower than 0.1 kg/cm², it is easy to prepare the plasma but the quartz glass tube cannot be heated sufficiently. When the pressure is higher than 1.5 kg/cm², the quartz glass tube easily deforms and an apparatus has a complicated design.

As described above, the microwave preferably has a frequency in the 2.4 GHz range. Power P which is absorbed by the quartz glass is expressed by the following equation:

$$P = k \times f \times E^2 \times \epsilon \times \tan \delta \quad (1)$$

wherein k is a constant, f is a frequency, E is a strength of electric field, , is a specific inductive capacity, $\tan \delta$ is a dielectric loss angle. When the dielectric loss is constant, the higher frequency f is advantageous. The power source having the frequency of 2.4 GHz is preferable since it is generally used and has a high reliability.

Figure 4:
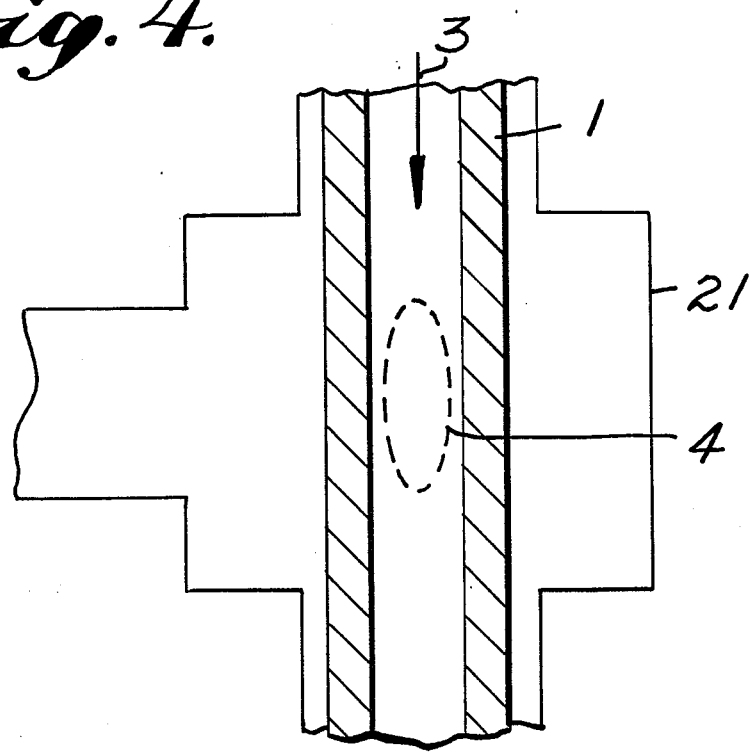
FIG. 4 is a schematic view of another embodiment of the heating method according to the present invention.
Figure 5:
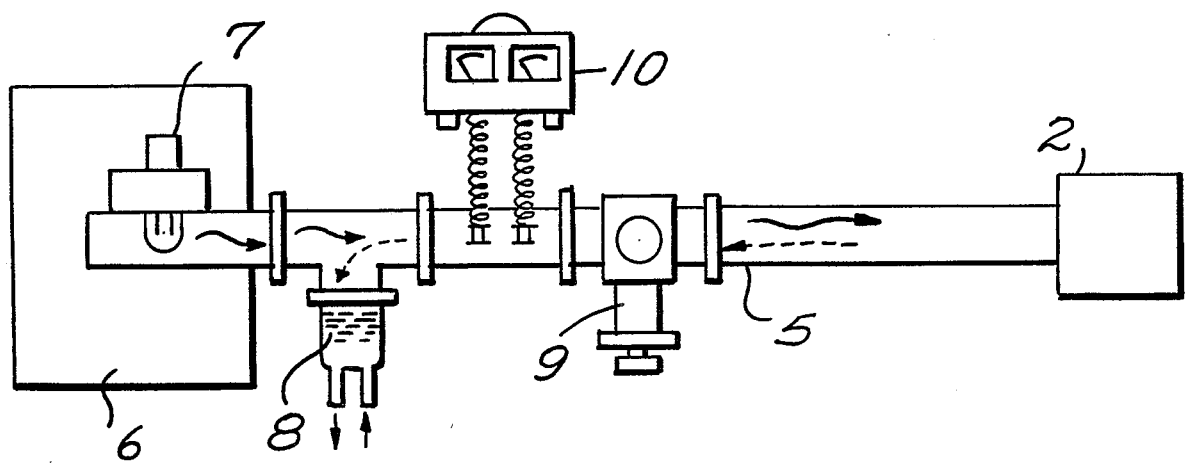
FIG. 5 is a schematic view of a microwave supplying system.

FIG. 4 is a view showing another embodiment of the heating method according to the present invention wherein the microwave irradiating member is a cavity resonator 21. FIG. 5 shows a microwave supplying system, in which the numeral 2 stands for the microwave irradiating member, the numeral 5 stands for a waveguide, the numeral 6 stands for a microwave generator, the numeral 7 stands for a magnetron, the numeral 8 stands for an isolator, the numeral 9 stands for a matching device, and the numeral 10 stands for a power monitor. An incident wave is indicated by a solid line arrow, and a reflected wave is indicated by a dotted line arrow.

According to the present invention, the quartz glass tube becomes hot and has the increased dielectric loss because of sufficient preheating. Since the microwave can be irradiated under such condition, the quartz glass tube can be heated to a high temperature.

Although a microwave output is not critical according to the present invention, a microwave electrical source generally has the output of 5 KW. When a higher power is required, a plural of the sources may be used and the modes of the sources in a specific form are introduced in one resonator so as to generate the higher power. The microwave output is, for example, from 3 to 5 KW during ionizing the gas for plasma generation so as to generate the hot plasma, from 2 to 4 KW during preheating the quartz glass tube and from 3 to 10 KW during absorbing the microwave.

The present invention will be illustrated by the following Examples.

EXAMPLE

The quartz glass was heated according to the present invention by using the microwave supplying system shown in FIG. 5 which had the waveguide having a rectangular cross-section of 55 mm × 110 mm and had a tubular opening having a diameter of about 40 mm at its tip end. During inserting a quartz glass tube (outer diameter: 26 mm, inner diameter: 18 mm) in the tubular opening, argon gas was supplied in the tube at a flow rate of one liter/min. under 1 atm. in an open system, and a carbon rod having the outer diameter of 4 mm was inserted in the tube. In this state, a microwave having a frequency of 2.4 GHz was applied at the output of about 3 KW so as to generate an argon gas plasma. After the plasma state was kept for about one minute, the supply of the argon gas in the tube was discontinued and the microwave was kept at the output of 4.5 KW for 3 minutes. The quartz glass tube could be heated to 2,000° C. or higher.

COMPARATIVE EXAMPLE

Figure 1:
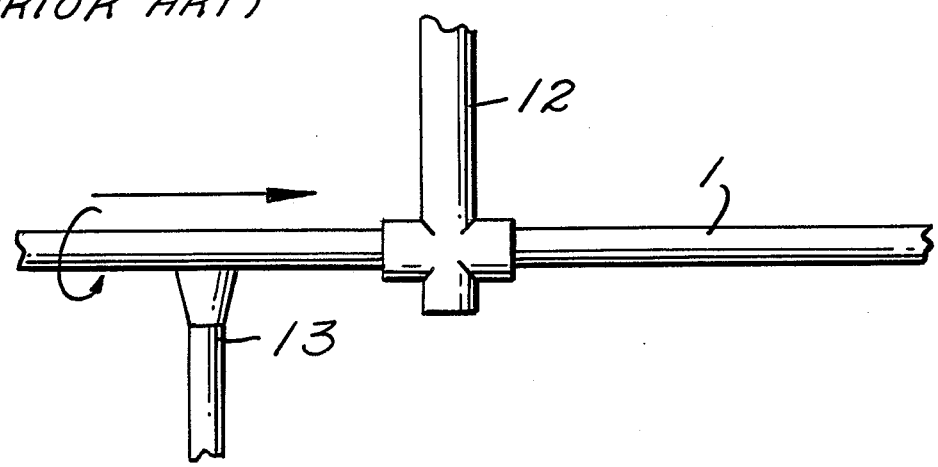
FIG. 1 is a schematic view showing a prior art heating method.

The microwave supplying system and the quartz glass tube which were the same as in Example were used. As shown in FIG. 1, while rotating the quartz glass tube 1 with grasping by a glass lathe, a portion of the quartz glass tube 1 was heated with a flame of an oxyhydrogen burner 13 so that a surface of the quartz glass tube was heated at a temperature of about 1,500° C. The heated portion was quickly inserted in the 2.4 GHz microwave waveguide 12 which was kept at the output of 4.5 KW. A temperature change of the quartz glass tube was measured. The temperature increase was not observed and the quartz glass tube was cooled. The quartz glass tube could not be heated sufficiently.

Results of Example and Comparative Example clearly show that the quartz glass tube can be heated sufficiently according to the present invention.

According to the present invention, the quartz tube is efficiently heated since the microwave irradiated portions of the quartz glass tube can be preheated to the very high temperature with the plasma gas so as to achieve the state in which the microwave is easily absorbed by the quartz glass tube, and the microwave is immediately irradiated. The preheating requires only a system for introducing the gas for plasma generation such as argon gas in the quartz glass tube. Since an external heating source as in the prior art is not necessary, the apparatus can be made compact and economically advantageous. An outer surface of the quartz glass tube is contaminated in the prior art, for example, because of use of a flame such as an oxyhydrogen burner flame or an preheating source such as an electric resistance furnace. According to the present invention, the quartz glass tube can be sufficiently preheated in a very quick and clear manner without contamination.

What is claimed is:

1. A method of heating a quartz glass tube with microwaves, which method comprises supplying a gas for plasma generation in the quartz glass tube, applying microwaves to the quartz glass tube so as to generate a hot plasma in the quartz glass tube and to pre-heat the quartz glass tube to a temperature whereby microwaves are absorbed by the tube, and then discontinuing the supply of the gas for plasma generation while continuing to apply the microwaves, whereby causing the quartz glass tube to absorb the microwaves to heat the tube.

2. The method according to claim 1, wherein the gas for plasma generation is at least one selected from the group consisting of argon, helium, oxygen and nitrogen.

3. The method according to claim 1, wherein the gas for plasma generation is argon.

4. The method according to claim 1, wherein the gas for plasma generation is supplied under a pressure of 0.1 to 1.5 kg/cm².

5. The method according to claim 1, wherein the microwave has a frequency of 0.1 to 10 GHz.

6. The method according to claim 1, wherein the microwave has a frequency of around 2.4 GHz.

7. The method according to claim 1, wherein the quartz glass tube is preheated by the hot plasma to at least 1200° C.

8. The method according to claim 1, wherein a microwave output is from 3 to 5 KW during ionizing the gas for plasma generation, from 2 to 4 KW during preheating the quartz glass tube and from 3 to 10 KW during absorbing the microwaves by the quartz glass tube.

* * * * *